(12) United States Patent
Rockwell et al.

(10) Patent No.: US 6,798,211 B1
(45) Date of Patent: Sep. 28, 2004

(54) POWER LINE FAULT DETECTOR AND ANALYZER

(75) Inventors: Daniel J. Rockwell, Ridley Park, PA (US); James P. Steiner, Royersford, PA (US)

(73) Assignee: Remote Monitoring Systems, Inc., Media, PA (US)

( * ) Notice: Subject to any disclaimer, the term of this patent is extended or adjusted under 35 U.S.C. 154(b) by 771 days.

(21) Appl. No.: 09/182,542

(22) Filed: Oct. 29, 1998

Related U.S. Application Data

(60) Provisional application No. 60/064,362, filed on Oct. 30, 1997.

(51) Int. Cl.⁷ .............................................. G01R 31/08

(52) U.S. Cl. ...................................................... 324/527

(58) Field of Search .............................. 324/52, 58.5 B, 324/527, 532, 533, 535, 555

(56) References Cited

U.S. PATENT DOCUMENTS

| | | |
|---|---|---|
| 4,500,834 A | 2/1985 | Ko et al. |
| 4,766,549 A | 8/1988 | Schweitzer, III et al. |
| 5,121,282 A | 6/1992 | White |
| 5,185,685 A | 2/1993 | Tennies et al. |
| 5,206,595 A * | 4/1993 | Wiggins et al. .............. 324/535 |
| 5,223,795 A | 6/1993 | Blades |
| 5,432,455 A | 7/1995 | Blades |
| 5,434,509 A | 7/1995 | Blades |
| 5,452,223 A | 9/1995 | Zuercher et al. |
| 5,459,630 A | 10/1995 | MacKenzie et al. |
| 5,561,605 A | 10/1996 | Zuercher et al. |
| 5,648,726 A * | 7/1997 | Le et al. ....................... 324/555 |
| 5,682,101 A | 10/1997 | Brooks et al. |
| 5,691,869 A | 11/1997 | Engel et al. |
| 5,729,145 A | 3/1998 | Blades |

OTHER PUBLICATIONS

Harry W. Ng et al. *Innovative Distribution Fault Location Development* (11 pp.).
J.P. Steiner et al. *An Automated Fault Locating System* (12 pp.).
Walter L. Weeks et al. *Surface Detection and Interpretation of Transient Signals On Underground Power Distribution Systems*, IEEE T &D 1994 (20 pp.).

(List continued on next page.)

*Primary Examiner*—Safet Metjahic
*Assistant Examiner*—Etienne P LeRoux
(74) *Attorney, Agent, or Firm*—RatnerPrestia

(57) ABSTRACT

A fault distance indicator (FDI), locates a fault in a power line by modeling pulses of reflected travelling wave signals which are generated from electrical arcs that occur as a result of the fault. Open loop power distribution circuits are arranged in two halves, each half comprising a circuit length from the overhead feed point to an open point with transformers and cable sections located along the circuit length. An FDI is inserted in each half of the loop. The FDI device monitors the circuit using an antenna which receives radio-frequency signals emitted by line faults and records the signatures of these faults. When the "trouble crew" arrives at the scene the recorded signature is downloaded to a portable PC via a radio, infra-red or other telemetry link. The downloaded data is analyzed first to generate a model of the reflected travelling wave signal and then parameters of the model are adjusted to minimize differences between the model and the actual data. The result is an approximate response characteristic of the faulted power line with arcs generated in the fault condition being modeled as an impulse. Parameters derived from this response characteristic direct the crew to the precise fault location.

35 Claims, 9 Drawing Sheets

OTHER PUBLICATIONS

H. L. Van Trees, "Classical Detection, Estimation and Modulation Theory, Part I", John Wiley and Sons, N. Y., Chapter 2.

H. W. Sorenson, "Maximum a Posteriori and Maximum Likelihood Estimators", Chpt. 5, NY 1980.

J .P. Steiner "Partial Discharge in Cables" Ph.D. Thesis, May, 1988, Purdue University, Chapter 4.

B. Widrow et al. "Adaptive Signal Processing", Prentice Hall, NY, 1985, Chapters 6 "The LMS Algorithm".

B. Widrow et al. "Adaptive Signal Processing", Prentice Hall, NY, 1985, Chapter 9 "Adaptive Modeling And System Identification".

* cited by examiner

POWER LINE FAULT DETECTOR AND ANALYZER

This application claims priority based on U.S. Provisional Application No. 60/064,362 which was filed on Oct. 30, 1997.

FIELD OF THE INVENTION

The present invention relates to apparatus for locating the position of faults in power lines and in particular to a system which monitors open loop underground residential distribution (URD) power cable systems for fault signatures and uses the fault signatures to locate the faults.

BACKGROUND OF THE INVENTION

Typical underground residential distribution power cable systems are configured as a loop with an open point along it. The URD loop cable sections are installed in between transformers that supply power to the individual customers. The underground cable system is fed from both ends by overhead power lines. Along the loop an open point is established so that each half is fed independently. When a fault occurs and the faulted section of cable is identified, the open point is moved to another transformer enclosure. In this manner the cable system can be sectionalized to isolate the failed cable section and quickly return power to the customer without having to repair the cable.

Sections of cable fail on a regular basis causing a blackout in the affected area. To return power to the customers, the repair crew must find the failed section of cable and reconnect the transformers with an available good section of cable. This process is called sectionalizing. To save time power utilities have installed devices called faulted circuit indicators (FCIs). In underground distribution systems, one device is installed on the cable at each transformer enclosure. The FCIs function as follows. Power is supplied to the cable from one end only (feed point); the other end is left open (open point). When the cable fails, a large over current passes through the cable from the feed point into the fault. This large over current trips the FCIs located in each transformer enclosure between the feed point and the fault. The FCIs in the transformer enclosures between the open point and the fault do not trip since no over current flows through these cable sections. The repair crew examines each FCI until they locate the last tripped FCI and the first untripped FCI; the failed cable section is between these two FCIs.

The trip indication takes different forms. More primitive devices require the repair crew to open each transformer enclosure and examine whether a mechanically operated indicator (operated by high current) shows an over current. The trouble crew must also mechanically reset these devices. More sophisticated devices have external indicators such as flashing lights and buzzers that beep. Some FCIs are radio-controlled. The more modern FCIs automatically reset when voltage returns to the circuit. A large number of these devices are needed to monitor a large distribution system. The problem with traditional FCIs is that they are expensive to install, time consuming to operate and somewhat unreliable.

Alternate technologies have been developed that use radar methods to locate faults. In these cases traveling waves are used to measure a time delay to the fault. Two primary methods are in use. The first method uses the transient waveform generated by the fault breakdown. In this case, the fault transient reflects back and forth between the fault and the end of the cable where the measurement is made. The round trip time delay is measured and interpreted as a distance to the fault. In the second case, a pulse signal is transmitted along the cable and is reflected from the fault. In this case, the pulse must be transmitted along the cable while the arc at the fault is ignited. The pulse is reflected from the arc and the round trip is interpreted as a distance to the fault. Both of these technologies are well known and have been in use for decades.

U.S. Pat. No. 5,206,595 to Wiggins et al. relies on the fault transient generated during breakdown. This method places a detector at the open circuit end of the cable and relies upon timing information from arriving signals that start and stop timing circuits. When the breakdown occurs, the transient travels to the end of the cable and starts a timer. It reflects from the end of the cable, travels back to the fault where it is again reflected and travels back to the open end of the cable. Upon arrival at the open end of the cable the timer is stopped. This round trip time is interpreted as a distance to the fault using a velocity which must be known.

The approach in U.S. Pat. No. 5,206,595 may not detect all faults and may erroneously detect non-fault conditions as faults. It is well known that URD cable systems are not homogeneous and have many discontinuities that give rise to interfering reflections. These interfering reflections can cause false stop signals in the timing circuit. Furthermore, the amplitude of the transient depends upon the voltage on the cable at the time of failure. Since this is not known prior to failure, this system must use a preset threshold in the comparator circuits to start and stop the timer. To reliably detect transients the threshold must be set low enough to trigger off the smallest anticipated transient. Having the threshold set low enough to ensure adequate sensitivity further aggravates the susceptibility to false stop triggers.

Another possible source of errors in a system of the type disclosed in U.S. Pat. No. 5,206,595 relates to the position of the sensor. The sensor is positioned at the end of the cable system. If a fault occurs close to the sensor it can not measure the round trip time to the fault unless extremely fast timers are used. To accurately measure the fault location very wide band electronics must be used. Using wide band electronics has the drawback that the circuitry is more susceptible to interfering reflections since they usually have higher frequency content than the transients of interest. Furthermore, this approach has no means to verify whether the transient was indeed from a true fault or some other transient event.

In U.S. Pat. No. 4,500,834 to Ko et al. an apparatus is described that places a detector at the end of the protection zone on a transmission line with protective relays. The fault detector is part of the protective relay located at the end of the zone and simply provides an indication of whether the fault is within the protected zone. The detector measures the time between successive reflections to determine whether the time delay is less than a predetermined value. If the time delay is less than the prescribed value the fault is in the protected zone otherwise it is not. The device does not provide a distance to the fault. Also, in a power transmission line system there are multiple protected zones and as such there will need to be multiple protective relays with this capability.

In U.S. Pat. No. 4,766,549 to Schweitzer, III et al. a system is described that applies to overhead transmission line power systems. The method uses a timing means to measure the time between successive reflections arriving at the end of the transmission line. This approach may have problems similar to those in U.S. Pat. No. 5,206,595. Because, however, the signals are filtered heavily prior to sampling at a low frequency some of the problems associated with wideband signals are mitigated. Furthermore, the system described in U.S. Pat. No. 5,206,595 may not be suitable for use in URD cable systems. When a fault occurs on an underground cable the fault transient is trapped between the fault and cable end. The fault has an extremely low impedance and no traveling wave energy can travel past it. In contrast, when a fault occurs on an overhead line the fault transient can travel across the fault since it has a much higher impedance. This difference in the transmission line structure makes the fault signatures and their interpretation much different.

SUMMARY OF THE INVENTION

The present invention is embodied in a system which locates the position of faults in URD cable systems. The cable system is continuously monitored and when a fault occurs its signature is recorded. A model of the fault signature is calculated using the recorded signature and the initial conditions of the cable system prior to the fault. The parameters of the model give the location of the fault which are used to sectionalize the cable system to isolate the failed cable section and return power to the customers.

URD cable systems typically are arranged in two halves, each half comprising a circuit length from the overhead feed point to an open point with transformers and cable sections located along the circuit length. According to one aspect of the invention, Each half loop uses one FDI. The FDI device monitors the circuit using an antenna which receives radio-frequency signals emitted by line faults and records the signatures of these faults. When the "trouble crew" arrives to repair the fault, the recorded signature is downloaded to a portable PC via a radio, infra-red or other data communications link. The downloaded data is analyzed and the crew is directed to the precise fault location.

DETAILED DESCRIPTION

Loop circuits are arranged in two halves, each half comprising a circuit length from the overhead feed point to the open point with transformers and cable sections located along it. Each half loop uses one of these devices. This device "listens" for a fault transient and records the signature. The data is analyzed and the crew is directed to the precise fault location. The system is then sectionalized and service returned to the customers. It should be noted that the open point in the loop could be located at one of the overhead feed points. If the open point is located at a feed point then only one device is used in the loop rather than two.

To understand how the fault is located it is helpful to describe the signature. When a fault occurs on a cable, an arc develops at the fault site and traveling waves are generated that resemble step voltages. These step voltage waves have magnitudes close to the voltage on the cable just prior to breakdown. However, the step voltages generated by the fault are opposite in polarity to the applied voltage. In addition, the arc at the fault site creates a short circuit on the cable at that point. The fault is readily modeled by a voltage source referred to as a compensating voltage source. This compensating voltage source meets the boundary conditions of the electromagnetic solution at the instant following the occurrence of the fault. In particular, the ideal voltage source has zero impedance and is used to model the fault impedance. Also, the compensating voltage source superposes with the voltage on the cable prior to breakdown giving a net zero voltage at the fault site; the compensating voltage source is equal in magnitude but opposite in polarity to the voltage on the cable at the time of the breakdown. In effect the compensating source is a voltage step generator that generates traveling waves from the position of the fault.

Typical URD cable systems are energized from an overhead power line. Also, at some point along the URD cable, an open point is established that allows for reconfiguring the cable system by moving the open point past the fault once it is located. Moving the open point allows for isolating the faulted section so that power can be returned to the customer. Reflections occur both from the cable open point and from the overhead feed point since these are both high impedances compared to the characteristic impedance of the power cable. The boundary conditions at these termination points are that the terminating impedances are considered to be open circuits.

Figure 1A:
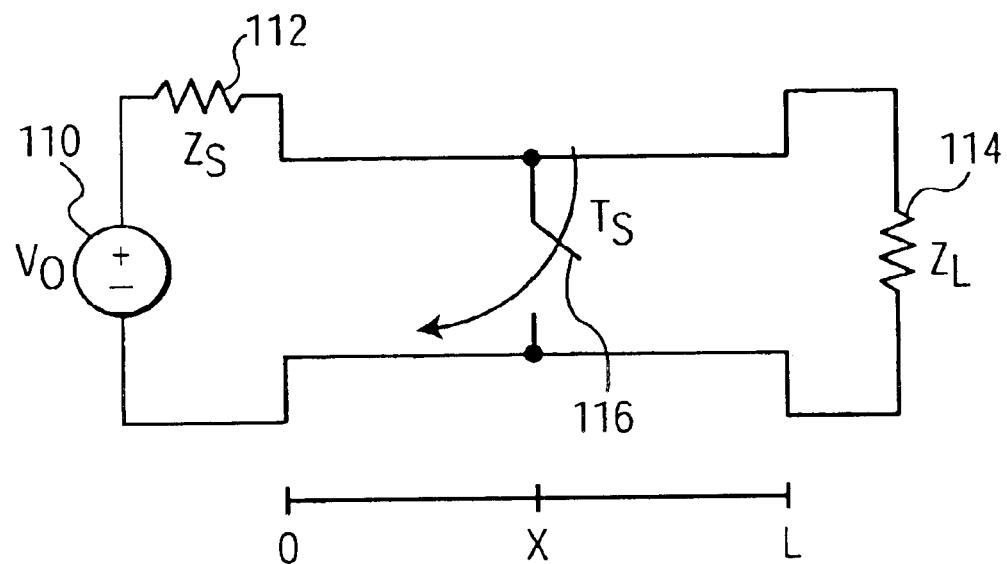
FIG. 1A is a schematic diagram of an equivalent circuit of a power line immediately prior to the occurrence of a fault.
Figure 1B:
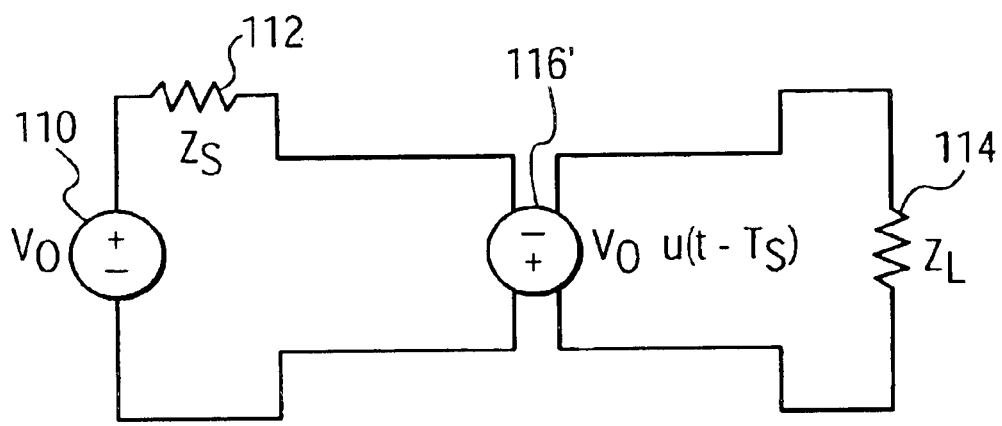
FIG. 1B is a schematic diagram of an equivalent circuit of a power line immediately after the occurrence of the fault.

FIG. 1A represents an electrical circuit immediately prior to a fault. The circuit includes a voltage source 110, a source impedance, 112 and a load impedance 114. The impending fault is represented by a switch 116. While the voltage source in practice is actually an ac source it is modeled as a dc source since the time frame considered is so short that the ac voltage changes very little. The fault is readily modeled by a voltage source referred to as a compensating voltage source 116,' see FIG. 1B. This compensating voltage source meets the boundary conditions of the electromagnetic solution (i.e. an electrical arc) at the instant following the occurrence of the fault. In particular, the ideal voltage source has zero impedance and is used to model the fault impedance. Also, the compensating voltage source superposes with the voltage on the cable prior to breakdown giving a net zero voltage at the fault site. In effect, the compensating source is a voltage step generator that generates traveling waves from the position of the fault.

The compensating voltage waves travel in both directions from the fault site to the opposite ends of the URD cable. Since the fault site is essentially a short circuit, the two sections of the URD cable behave independently of each other, each with its own transient traveling wave. Both halves of the cables behave similarly so only one half of the cable need be considered in this description. As the traveling wave reaches the end of the cable it is reflected from the termination which is modeled as an open circuit. The reflected wave then travels back to the fault site where it is reflected from the fault impedance, which is modeled a short circuit. The traveling wave repeatedly reflects back and forth until its high frequency energy is dissipated; this process takes a fraction of a millisecond. This phenomena can repeat each time the excitation voltage (e.g., the 60 Hz voltage) passes through zero volts, extinguishing the arc and then reaches the breakdown voltage again re-igniting the arc. The process eventually stops when the power system fuses or reclosers disconnect power. Similar reflections processes occur in both halves of the cable system.

Both voltage transients and current transients travel in the faulted cable and are related by the characteristic impedance of the cable. The reflections from the open end and the fault have magnitudes and polarities determined by the well known solution of a set of equations describing the electromagnetic propagation of waves in cables:

$$\frac{dV(z,s)}{dz} = -[sL+R]I(z,s)$$

$$\frac{dI(z,s)}{dz} = -[sC+G]V(z,s)$$

where $V(z,s)$ and $I(z,s)$ are the Laplace transforms of the voltage and current in the cable, s is frequency, z is distance along the cable, L is the inductance per unit length, C is the capacitance per unit length, R is the resistance per unit length and G is the conductance per unit length. Since superposition applies, it is only necessary to consider those portions of the solution that apply to the occurrence of the fault. As described above, the following boundary conditions may be used to calculate the solution:

Voltage on the cable prior to breakdown
Impedance of the fault (assumed to be zero for simplicity)
Impedance of the termination point (assumed to be infinite for (simplicity)

Using these boundary conditions a general solution can be developed that describes the transients in the cable. The general solution of the transmission line equations is $$V(z,s) = \frac{F(s)e^{-2\gamma d}}{1+e^{-2\gamma d}}e^{\gamma z} + \frac{F(s)}{1+e^{-2\gamma d}}e^{-\gamma z}$$

$$I(z,s) = -Y_0\left[\frac{F(s)e^{-2\gamma d}}{1+e^{-2\gamma d}}e^{\gamma z} - \frac{F(s)}{1+e^{-2\gamma d}}e^{-\gamma z}\right]$$

where $Y_0$ is the characteristic admittance of the cable. The variable $\gamma$ is the frequency dependant propagation constant that describes the attenuation and velocity in the cable. It is assumed that the Laplace transform of the compensating voltage source is F(s) and the fault is located at z=0 and the termination point is at z=d. In the simplest terms the propagation constant can be defined as $$\gamma = \alpha + j\omega\beta \text{ and } \beta = \frac{1}{\sqrt{LC}}$$

where $\beta$ is the velocity of propagation.

Now consider how the transients are measured. One way of measuring the transient is to use inductive coupling. A simple loop antenna can be used to measure the signal. Depending upon the nature of the coupling means the measured signal differs from the actual transient in the cable. The effect can be described by a linear transfer function that filters the compensating voltage source as follows $$X(s)=H(s)F(s)$$

where H(s) is the transfer function of the coupling device.

The detector is placed along the cable system at a position x far from the termination points. The measured signal is easiest understood by performing a series expansion of the transmission line solution. The series expansion of the current waveform at the position x for the first five terms is $$I(x,s) = -Y_0 V_0 F(s) H(s) [e^{-\gamma x} - e^{-\gamma(2d-x)} - e^{-\delta(4d-x)} + e^{-\gamma(4d+x)} \ldots]$$

where $V_0$ is the voltage on the cable at the time of breakdown and F(s) is a unit amplitude step voltage.

To locate the fault it is necessary either to know or estimate the following variables d: the distance from the fault to the termination
x: the distance from the fault to the measurement position
$\gamma$: the propagation constant
$V_0$: the voltage at breakdown
$Y_0$: the characteristic admittance of the cable.

The location of the fault is obviously unknown, however, the position of the measuring device is known to be d-x. By phase locking to the power system voltage it is possible to measure the voltage $V_0$. This is easily done because the device needs to be powered by line voltage. The characteristic admittance is known from the specifications for the various cables under consideration. F(s) is assumed to be a perfect step voltage and the transfer function, H(s), is know since it is a design parameter of the coupling device. Only d or x needs to be estimated since the relationship between them is know. The propagation constant, $\gamma$, is only approximately known and is desirably estimated to get improved results.

The model described above only considers the impedance discontinuities due to the fault and the termination point. In any practical system there are other impedance discontinuities that give rise to other reflections. These other reflections are called clutter and come from splices, transformer connections, differing soil conditions, changes in cable type, etc. These minor impedance discontinuities can corrupt measurements if not taken into account. As an example, consider systems that use timers started and stopped by the measurement of a transient pulse. In these cases, a simple threshold crossing (level comparator) is used to measure the arrival of the transient and either starts or stops a timer on its arrival. Since the comparator can not distinguish between clutter and transients due to reflections from the termination (or fault) it either starts or stops the timer on any pulse and errors can result. The most effective measurement system should be able to account for the clutter.

One way to account for the clutter is to consider it to be interference and design an estimator that minimizes the error from the interference. Consider the signal model $$y(t)=s(t)+n(t)$$

Where y(t) is the measured signal, s(t) is the desired signal and n(t) is an interference term. Considering the signal y(t) to be probabilistic, an effective way to estimate s(t) is to make a maximum likelihood (ML) estimate of the signal s(t). The likelihood function is then maximized by finding the estimate of s(t) such that $$\frac{\partial \ln p_{y|s}(Y|S)}{\partial S}\bigg|_{s=\hat{s}} = 0$$

If the clutter is modeled as a Gaussian random variable then the maximum likelihood estimate of s(t) is the estimate that minimizes the mean squared error:

$$\text{Min}_s E\{[y(t)-\hat{s}(t)]^2\}$$

where E is the expected value operator and is the estimate. The model for the transient given is a good choice for the form of the estimator since it only accounts for the major reflections and ignores the clutter. The result is that the clutter is treated as interference and the minimization gives the best mean square fit of the model to the data. The model parameters used to generate the signal that minimizes the mean square error contain the fault location. The advantage of using a method of this type is that it is relatively insensitive to the presence of the clutter. The model can be estimated in a number of ways. One can use just the first two terms in the series expansion and match it to the data. A similar approach may be used with three terms or five terms. Each additional term, however, requires more computation. It is desirable to use at least three terms to be able to estimate the velocity of the travelling wave in the cable. Thus, the exemplary algorithm is as follows:

1. Select the first pulse as the signal of interest and create a pulse model using a suitable parametrically adjustable pulse. For example, use a Gaussian pulse.

2. Successively model the remaining reflected pulses using the propagation model.

3. Search the parameter space for that parametric set that minimizes the mean square error between the first pulse and the reflected pulses on the one hand and the modeled pulses on the other hand. The search could use any number of strategies. For example, using a steepest decent procedure.

4. The minimization is carried out in the time domain with the time delay of the parameterized pulses being related to the location of the fault. To understand the relationship of the parameters to the fault location consider the Fourier transform of the solution $$I(x,\omega) \propto G(\omega)[1-e^{-j\omega\beta(2d-2x)}-e^{-j\omega\beta(2d)}+e^{-j\omega\beta(4d-2x)}+e^{-j\omega\beta(4d)}\ldots]$$

where $G(\omega)$ is the Gaussian pulse moved to time zero and the attenuation is ignored. The exponential terms are recognized as simple time delays that displace the Gaussian pulse by the appropriate time shift. The term (2d−2x) is the round trip time from the cable end to the detector and 2d is the distance of the fault from the cable end etc.

5. The velocity is simply calculated using the known position of the detector (2d−2x).

The above procedure results in highly accurate estimates of the time delays and velocity. However, in some instances, the map of the cable system is not known to the same precision as the estimates. This results in errors in locating the fault since the estimated position can not be related to where the cable is buried.

A calibration procedure may be used to improve the results. The goal of the measuring system is to determine which cable section has failed so that it can be isolated. If the cable map is not known precisely and the fault occurs near a transformer, it may be difficult to determine which cable section has failed; it could be on either side of the transformer. To remedy this situation a measurement can be made that determines the map of the cable system.

In the exemplary system, only the location of each transformer is determined. The parameterization of the model is conducted using time delays. If a measurement of the time delay to each transformer was available, then it would be a simple matter to compare the time delay parameters of the best fit model with the measured time delay location of the transformers. Such a comparison would unequivocally identify the failed cable section and place it between two transformers.

The following procedure may be used to calibrate the time delays. A signal source can be used to inject a pulse into an energized power system. The pulse can be capacitively coupled into the cable at the open point. A loop antenna similar to one used to detect the signals in the on-line monitor can be placed above the ground near the transformer. With the appropriate gain in the receiver, the signature can be measured just as in the case of a fault transient. The same algorithm may be used to analyze the pulse signature to determine the time delay position of the transformer. The time delay position of each transformer can be determined in this manner and stored for use when a fault occurs. Alternatively, after the cable has failed, the calibrator can be connected to the cable system to inject calibration pulses. In this instance, the fault location is already known and the calibration method is used to verify the side of the transformer on which the fault is to be found.

Figure 2:
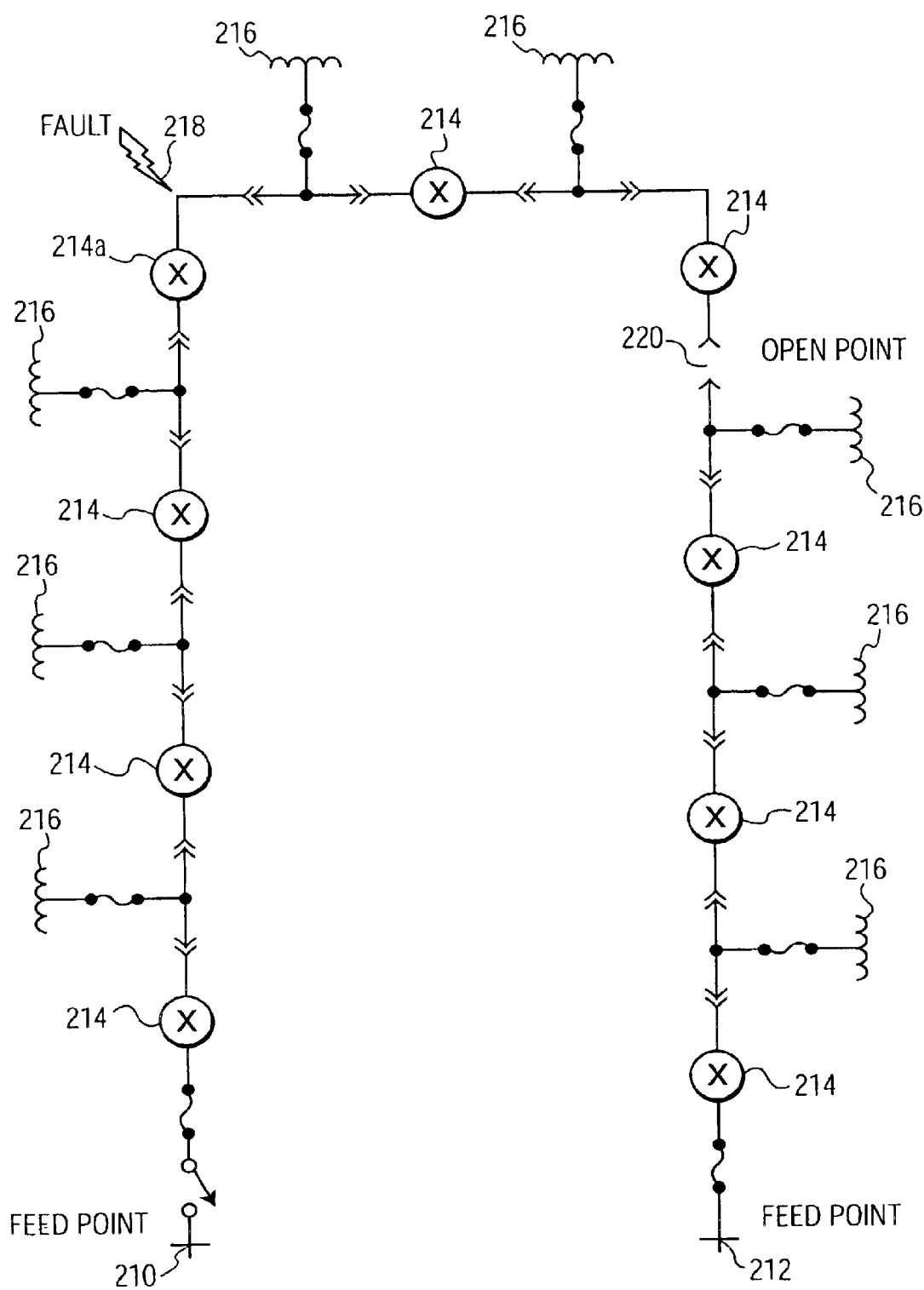
FIG. 2 is a schematic diagram of an electric power distribution system which the subject invention may be used.

FIG. 2 is a system diagram of a URD power system. The distribution system includes two feed points, 210 and 212. Each feed point is connected to a plurality of transformers 216 by underground power cables. The system includes multiple faulted circuit indicators 214, of the type traditionally used. The loop circuit shown in FIG. 2 also includes an open point 220 which separates the transformers supplied from the feed point 210 from those supplied from the feed point 212. When a fault occurs, for example at point 218, all of the faulted circuit indicators 214 between that point and the feed point 210 trip. After the fault is located, the loop is opened on either side of the faulted circuit indicator 214a and is closed at the open point 220. With this modification in the circuit, the faulty section of cable, including the point 218, is isolated from the feed points 210 and 212 and every transformer 216 is connected to one of the feed points. Thus, power is restored and the faulty section of cable can be safely repaired. The FDI can replace all of these faulted circuit indicators with a single unit in if each half loop.

Figure 3:
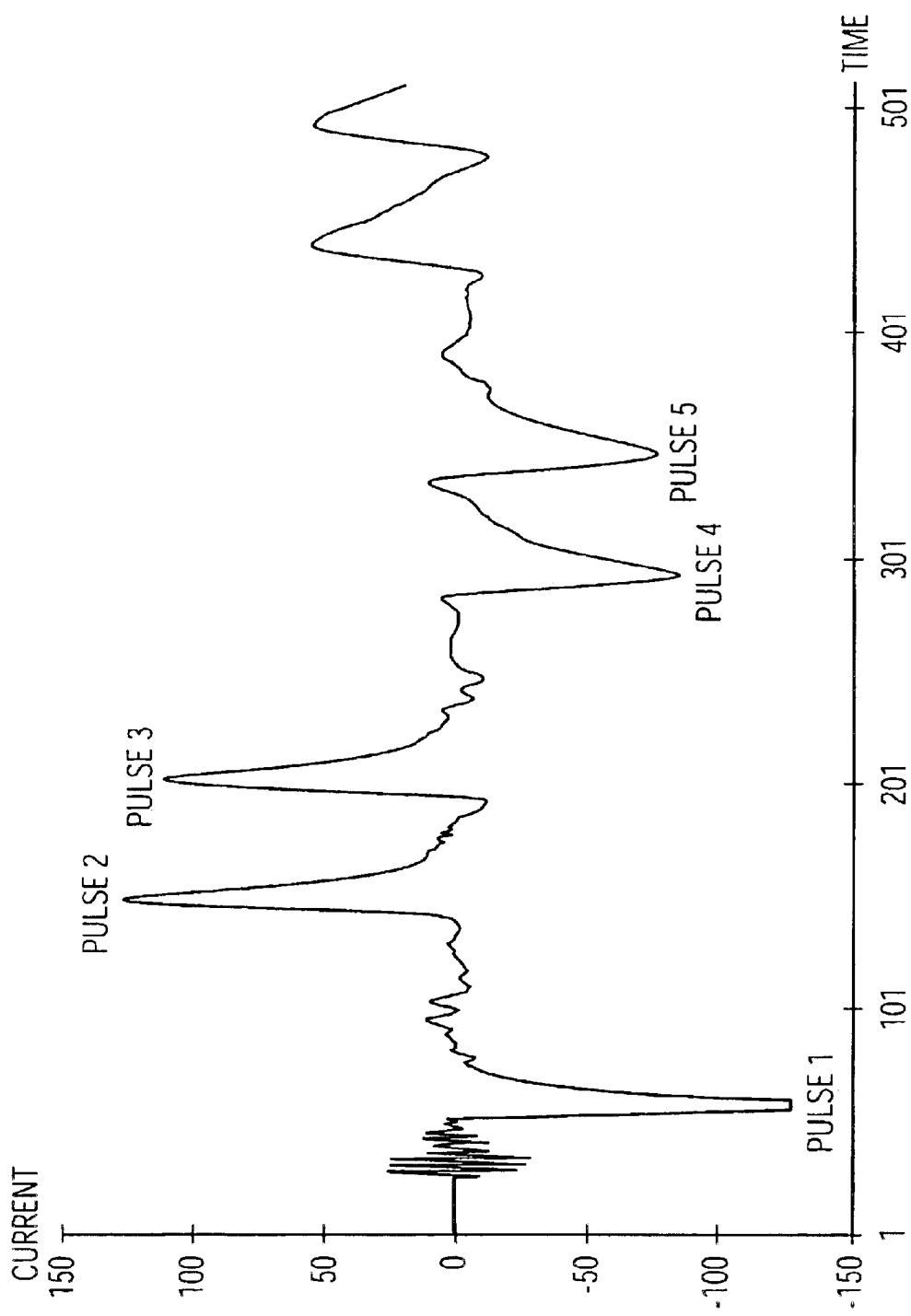
FIG. 3 is a graph of current versus time which illustrates the electromagnetic response of the power distribution system shown in FIG. 2 to a fault.

A typical current transient signal received by a fault distance indicator (FDI) according to the present invention is shown in FIG. 3. The high fidelity of the current transient is one of the key points; this is due to the design of the antenna and its placement within the system. To understand the waveform, each pulse in FIG. 3 is labeled numerically. Pulse 1 is the initial breakdown transient that first passes the antenna. Pulse 2 is the first reflection from the end of the cable. Pulse 3 is the first reflection from the fault. Pulse 4 is the second reflection from the end of the cable and pulse 5 is the second reflection from the fault. These reflections continue until the RF energy generated by the arc is dissipated. Measuring the time delay between these pulses give the distance between the fault and one end of the cable. Measuring the polarity of the pulses provides an indication of which end of the cable should be used as reference to locate the fault.

The simplest way to measure the time delays between the pulses in FIG. 3 is to measure the positions of the peaks. However, doing so may result in bias errors. As set forth above, a better way to measure the time delays is to calculate a maximum likelihood estimate of the time delays. A simple delay estimation procedure may be used to provide a good "initial guess" for the model. The pulse separations in the model are adjusted until the model best fits the measured data. As described above, the time delays and other parameters used in the best fit model are the maximum likelihood estimate of the time delays.

The cost of the monitor is proportional to the sampling rate used. The sampling rate required for acceptable signal analysis is approximately four times the 3 dB bandwidth of the signal (twice the Nyquist rate). The bandwidth required to resolve two closely spaced pulses reliably is approximately the inverse of the individual pulse width. The minimum pulse width required to resolve a fault is at least half of the round trip travel time from the fault to the open point in the cable with approximately 4 ns required for each foot of round trip travel. Placing the monitor in the center of the cable minimizes the bandwidth requirements since the round trip time can never be less than from the center of the cable to the open end. In a typical underground distribution system, this distance would be approximately 1,250 feet yielding a desirable sampling rate of approximately 2 MHz. Higher sampling rates may be used and the cost of the product can remain within desirable limits. Because these higher sampling rates increase the accuracy and noise immunity of the system a sampling rate greater than 2 MHz is used in the exemplary system.

If the monitor were placed at the open end of the cable and if a fault occurred ten feet from the end a sampling rate of at least 100 MHz would be needed to accurately resolve the position of the fault. The reason for this high sampling rate is to allow the instrument to resolve two individual peaks separated by 40 ns (four samples). The advantage of placing the device near the center of the loop is obvious from a complexity and cost standpoint. The cost of analog-to-digital converters and digital signal processors which operate at a sampling rate exceeding 40 MHz sampling rate may be very high. Furthermore, using components that operate with the large bandwidths needed to measure the signal at the end point, may not produce the desired result as the fault signal may be distorted since power cables and their terminations are not designed for high frequency operation.

There is a problem, however, with placing the sensor close to the center of the cable as proposed for this system. The problem is that an ambiguity appears. Just measuring propagation time, it is not possible to determine where the fault is with respect to a particular open end of the cable. To understand this ambiguity, consider the case where the antenna is placed in the exact middle of the cable under fault. When a fault occurs, the instrument has no means to determine which side of the detector on which the fault occurred because the cable system is symmetrical. Since there are two choices, all that can be determined is that the fault is an estimated distance from one of the two cable ends. This ambiguity is resolved if one knows the direction of travel of the current pulses. Having this information places the fault toward one open end or the other.

This ambiguity can be resolved using the following approach. If the loop antenna is placed in a known orientation and the absolute polarity of the current pulse is known then the direction of travel of the current transient can be determined. The absolute polarity of the current is determined by the polarity of the voltage on the cable just prior to breakdown. This can easily be monitored using either an electric field probe, capacitive voltage tap or by direct connection to the secondary side of a transformer. The inventors have also determined that in URD circuits, by measuring the current phase using a low-frequency current sensor, the voltage phase can be determined. In this manner, the instrument is able to determine the direction of travel of the waveform and therefore resolve the ambiguity.

Figure 4A:
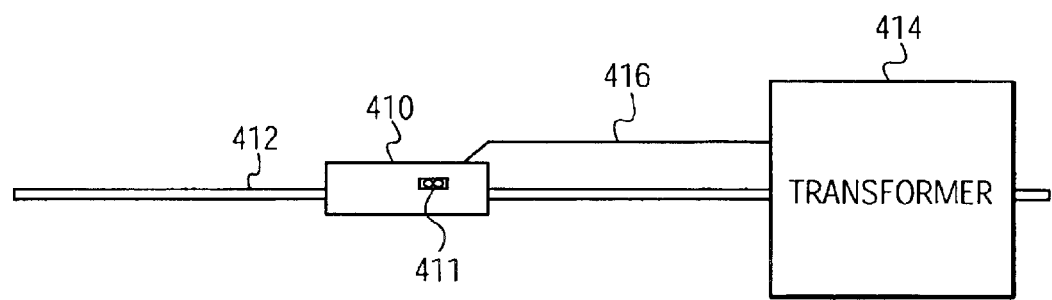
FIG. 4A is a plan drawing which illustrates the installation of a fault distance indicator (FDI) according to the present invention on in a power distribution system.
Figure 4B:
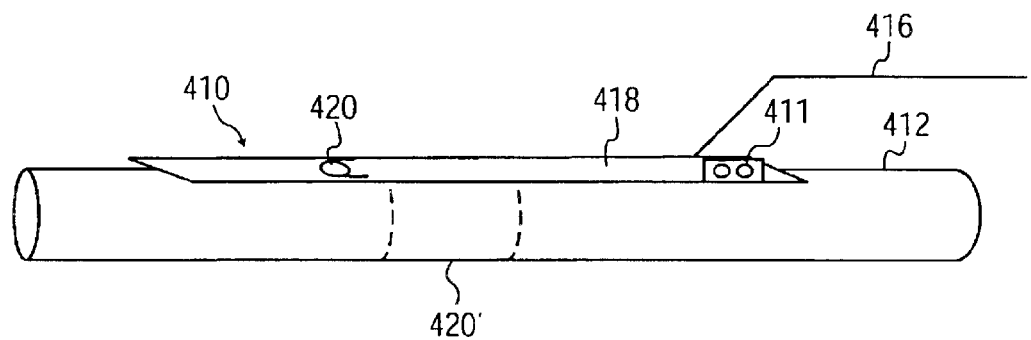
FIG. 4B is a perspective drawing which is useful for describing the configuration and operation of the FDI shown in FIG. 4A.

FIGS. 4A and 4B illustrate one exemplary embodiment of the invention. FIG. 4A shows a power line 412 and a transformer 414. The FDI 410 is mounted directly on the power line 412 within the transformer enclosure (now shown. The exemplary FDI shown in FIG. 4A is powered by a power signal obtained from the transformer secondary (e.g. 110V) via a conductor 416. The FDI also includes a transceiver 411. An infrared transceiver including a photodiode and a light emitting diode (LED) is shown although:it is contemplated that other types of transceivers, for example radio frequency or ultrasonic, may be used. FIG. 4B shows the FDI 410 with the cover removed. The exemplary FDI includes an antenna 420 and a circuit board 418 in addition to the transceiver 411. The exemplary transceiver 410 also includes a battery (not shown) which provides power to the unit when power is lost due to a fault on the power line. The antenna 420, which may be, for example, a loop of wire positioned in parallel with the power line 412, is designed to receive electromagnetic radiation emitted in response to a current flowing through the line. Thus, the measured signal is proportional to the fault current. Alternatively, the FDI may include an antenna 420' which is designed to receive electromagnetic radiation emitted in response to the voltage on the line. This antenna may be, for example, an annular metal band which surrounds the cable at an unshielded location, capacitively coupling the circuit to the power cable. Alternatively, the antenna 420' may be implemented using a conventional high voltage cable termination (not shown) which includes a capacitive tap.

Figure 5:
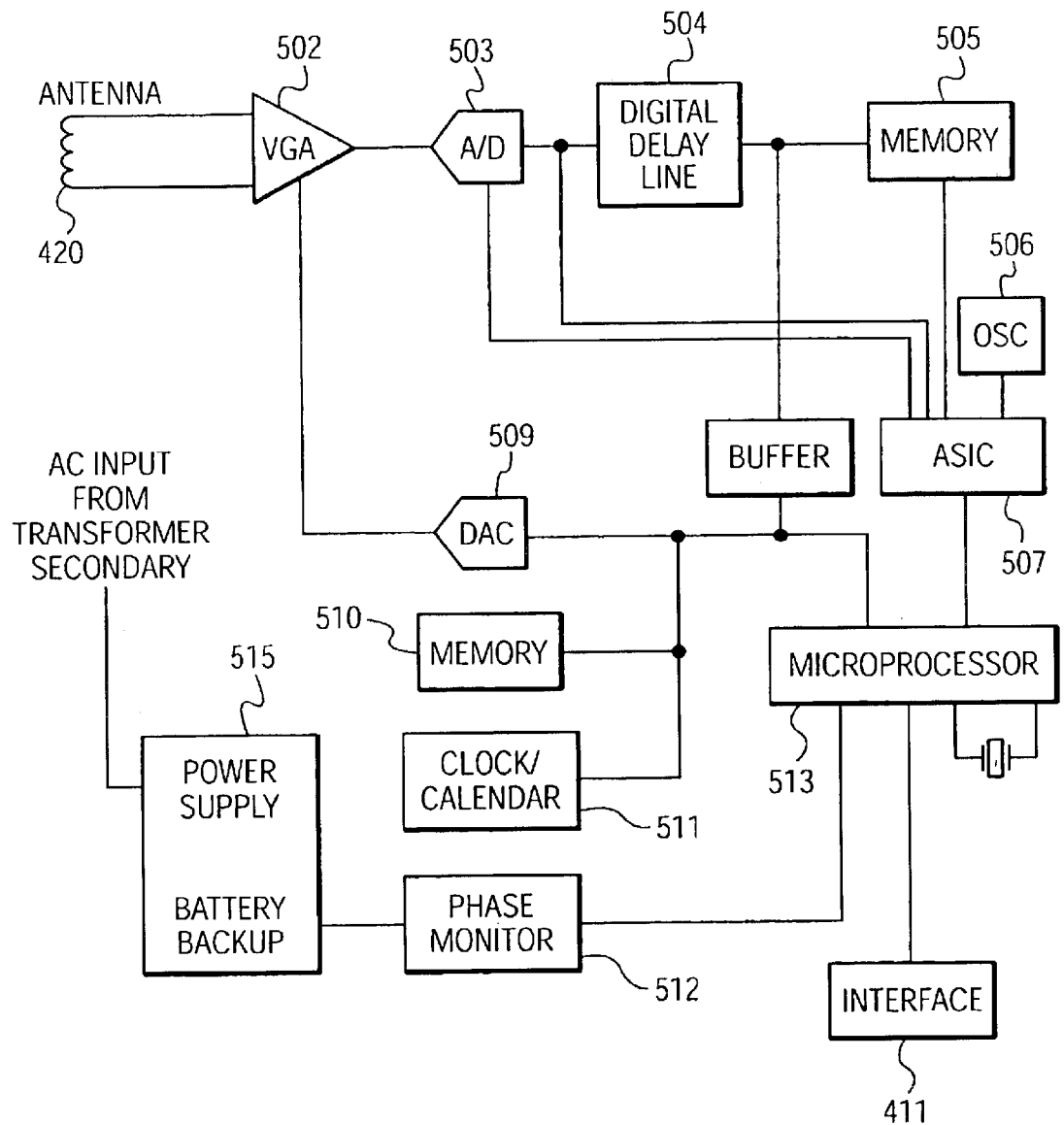
FIG. 5 is a functional block diagram of the FDI shown in FIGS. 4A and 4B.

FIG. 5 illustrates one example of an implementation of the Fault Distance Indicator (FDI). This implementation applies to current impulse waveforms, and by duality it readily applies to voltage waveforms.

As set forth above, when a fault occurs in a power cable a transient current pulse is generated at the fault location that travels in both directions from the fault to either end of the cable. The transient current pulse is reflected from the ends of the cable and returns to the fault site where it is again reflected back toward either end of the cable. The transient current pulse continues to reflect back and forth between the fault and the end of the cable until the energy in the pulse is dissipated.

The FDI is installed at some point along the power cable where it sits and listens for the fault condition to occur. The antenna detector assembly 420, is magnetically connected to the faulted cable, and it is capable of detecting the transient current pulse as it passes by. The output signal of the antenna detector assembly 420 provides the input signal to the variable gain amplifier (VGA) 502.

The VGA 502 amplifies the input signal in proportion to the phase of the AC voltage waveform at the time of the breakdown. The amplified analog signal from the output of the VGA 502 is the input signal to the analog to digital converter (A/D) 503.

The digital representation of the analog signal is passed from the A/D 503 to the application specific integrated circuit (ASIC) 507. The digital representation of the analog signal also passes through the synchronous digital delay line (SDDL) 504, and is presented at the output port of the SDDL 504 where it is delayed by "N" samples, where N is the length of the SDDL 504.

The ASIC 507 uses the digital signal presented at the output port of A/D 503 and the input port of SDDL 504 to determine if a break down transient signal is present at the antenna 420. When the ASIC 507 detects an active break down transient; it controls memory 505 to collect the full transient break down waveform.

The memory 505 receives data samples at the output of the SDDL 504 delayed in time by length of the SDDL 504 itself. The length of the SDDL 504 is determined by the sampling rate, trigger level and slope of the initial pulse. For the software to operate with the greatest accuracy in its delay estimations, it is desirable, that all data samples of the initial break down are recorded. Therefore this pre-trigger mechanism, including the SDDL 504, ASIC 507 triggering mechanism and data collection method, are an important factor in the accuracy of the software estimations.

The ASIC 507 is driven by oscillator 506, and it provides clocking and control of the A/D 503, SDDL 504 and memory 505. When the complete transient waveform is collected into memory 505 ASIC 507 asserts an interrupt on microprocessor 513 to register the fault condition. As set forth above, the oscillator may operate in the range of 2 MHz to 100 MHz or more preferably between 20 MHz and 40 MHz, and most desirably at 20 MHz.

Microprocessor 513 acknowledges the fault condition and de-asserts the interrupt from ASIC.507. It further confirms the fault condition by verifying that there is a loss of primary AC power. Microprocessor 513 reads the clock calendar 511 following the fault event and stores the date and time of that the fault occurred into its local memory 510, along with the phase of the AC voltage waveform at the time of the breakdown.

The VGA 502 is part of an adaptive gain circuitry that is specially designed to maximize the dynamic range of the input signal captured at the time of the break down fault condition. Specifically, the fault current available in the transient pulse generated by the fault is proportional to the amplitude of the AC voltage on the cable at the time of the breakdown, and the characteristic impedance of the cable. At the frequency of interest, the characteristic impedance of the cable is essentially fixed at about 30 Ohms, and only the voltage is a variable. The power supply 515 is connected to the secondary side of the transformer, and the phase of the voltage waveform is passed from the power supply circuitry 515 to the phase monitor 512.

The phase monitor 512 asserts an interrupt on microprocessor 513 at each zero crossing of the input voltage waveform. Phase monitor 512 also provides phase information to microprocessor 513 about the phase of the AC voltage at the time of the fault event. The phase of the voltage waveform at the time of the break down is used by the estimation software to determine the direction to the fault.

The FDI is also designed as a one size fits all device that operates independently of the operating voltage of the power system. Most typically URD circuits operated at 15 KV, but 25 KV and 35 KV are also common voltages that are used in practice. The microprocessor 513 sets the operating point of the VGA 502, then continuously adjusts the gain about the operating point in such a way as to maximize the dynamic range of the input signal to the A/D 503. The gain of the VGA 502 is set to its maximum value for the selected operating point when the voltage is at a zero crossing, and it is set to its minimum value for the selected operating point when the voltage is at its peak. The gain of the VGA 502 is set by the output of the digital to analog converter (DAC) 509, and the DAC 509 receives its digital input from the microprocessor 513.

The power supply circuitry operates from the AC input provided by the secondary side of the transform in which the FDI unit is installed. After interruption of primary power, the FDI circuitry continues to operate from the battery backup provided in the power supply 515. The FDI circuitry preferably operates in an uninterrupted manner during the time primary power is collapsing. The full circuitry is not required to be powered after the full waveform has been captured. Therefore, microprocessor 513 removes power from unnecessary circuitry in an attempt to conserve the battery power. The full circuitry is automatically powered on when the primary power is restored.

After the waveform is stored to memory 505, and the phase information at the time of break down is stored to memory 510, the system is ready to perform the fault location estimation. This can be achieved by executing the estimation software on the microprocessor 513, or alternatively by transferring the waveform information from microprocessor 513 through the communication interface 411 to an external computer that executes the estimation software.

If the estimation software is executed on the microprocessor 513 that is integral to the FDI, the results are presented to the user through the communication interface 411, and presented as a distance and direction to the fault. Additionally, the fault condition and location information could be communicated to a central dispatch location using any one of a number of communication means, including, for example, cellular services.

Figure 6:
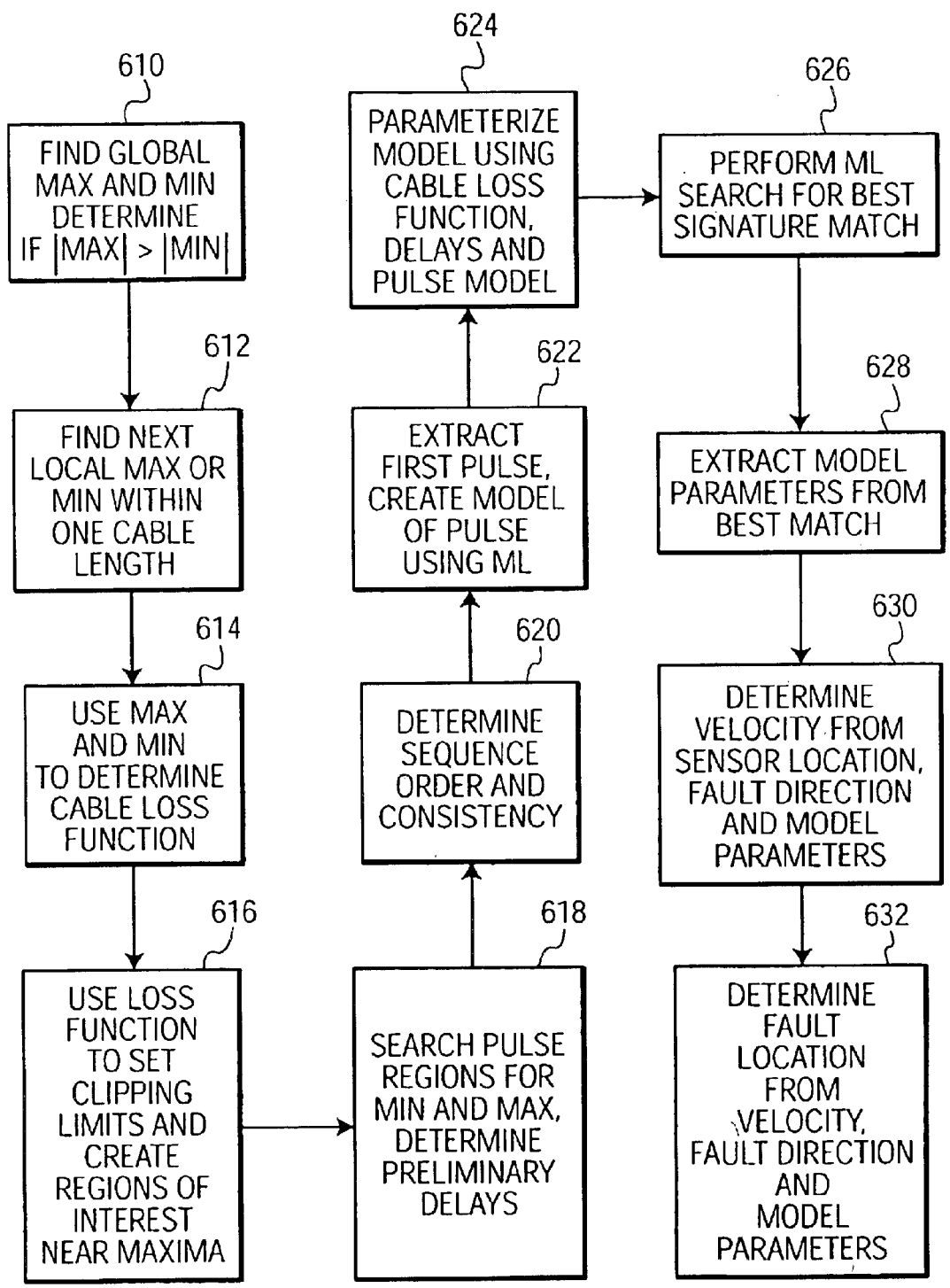
FIG. 6 is a flow-chart diagram which is useful for describing the operation of the FDI shown in FIG. 5.

FIG. 6 is a flow-chart diagram which illustrates the operation of the fault analyzer. As described above, the fault analyzer (not shown) may be implemented as a conventional personal computer having a transceiver to request data and receive data from the FDI 410. This transceiver (not shown) is essentially the same as the transceiver 411 of the FDI 410. The first step in the processing by the fault analyzer, step 610, is to find the global maximum and minimum values for each stored waveform and to determine if the magnitude of the maximum value is greater than the magnitude of the minimum value. Next, at step 612, the analyzer locates the next local maximum and/or local minimum within one cable length. At step 614, the relative amplitudes of the global maximum and minimum and the next local maximum and minimum are used to determine a cable loss function. At step 616, the analyzer uses the loss function to set clipping limits and to define regions of interest near the maxima and minima. Next, the analyzer, at step 618, searches each region of interest for minimum and maximum values to determine a preliminary estimate of the propagation delay of the transient pulse through the cable. Step 620 then searches all of the maxima and minima to determine the sequence of events and to ensure that that sequence is consistent.

At step 622, the analysis continues by creating a model of the pulse and pulse propagation using a maximum likelihood technique. The analyzer, at step 624, parameterizes the model using the cable loss function, preliminary pulse propagation delays and the pulse model. A maximum likelihood search is then performed at step 626, adjusting the parameters of the model to find the best signature match. This signature match is optimized over all of the relevant sample data that are collected from the FDI 410. At step 628, the analyzer extracts the model parameters from the best match and, at step 630, determines the velocity of the fault from the sensor location, fault location and model parameters. At step 632, the fault location is determined based on the calculated fault velocity and fault direction.

Figure 7:
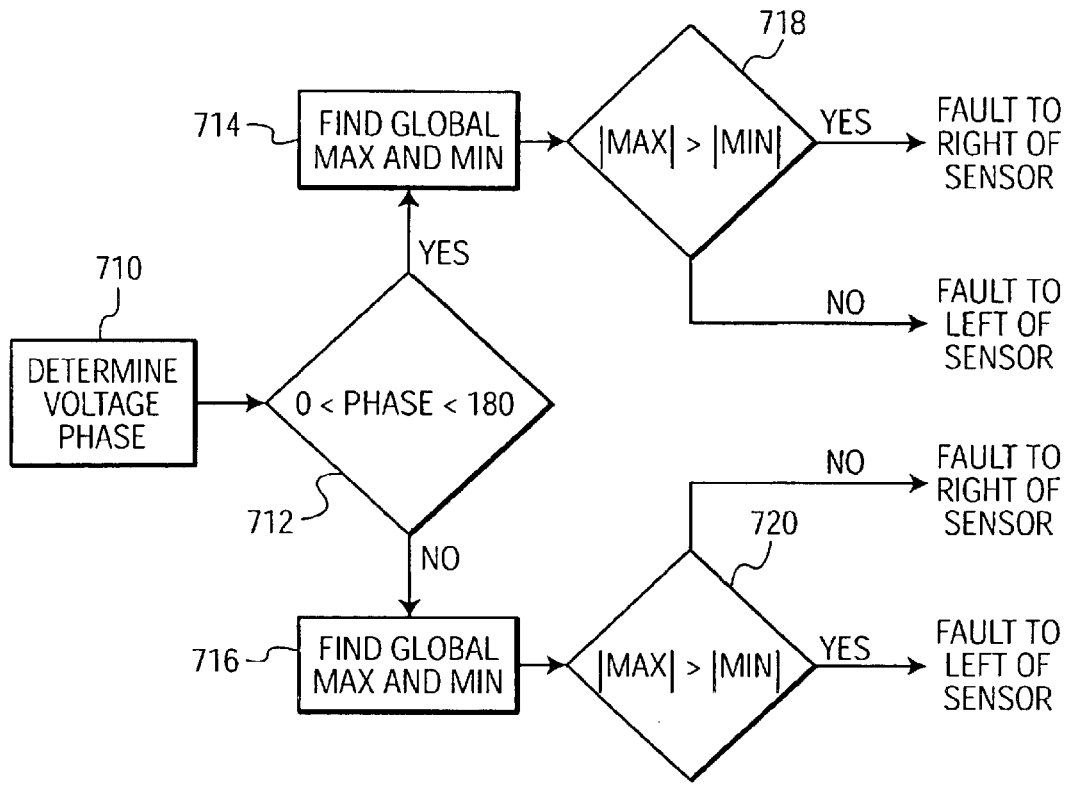
FIG. 7 is a flow-chart diagram which is useful for describing the method by which fault direction is determined in the process illustrated by the flow-chart diagram of FIG. 6.

FIG. 7 is a flow-chart diagram which illustrates the process by which the analyzer determines the direction of the fault in the line relative to the FDI 410. The first step 710 in the process determines the voltage phase. Step 712 determines if the phase is in the range of 0° to 180°. If the phase is in this range, then control passes to step 714 which identifies the global maximum and minimum values for the fault pulse. At step 718, if the magnitude of the maximum is greater than the magnitude of the minimum, then the fault is to the right of the FDI 410, otherwise the fault is to the left of the FDI. If, however, at step 712, the measured phase of the power signal is not in the range of 0° to 180°, then, at step 716, the global maximum and minimum are determined and, at step 720, if the magnitude of the maximum is greater than the magnitude of the minimum, then the fault is identified as being to the left of the FDI 410 and if the minimum is greater in magnitude than the maximum, the fault is identified as being to the right of the FDI 410.

Figure 8:
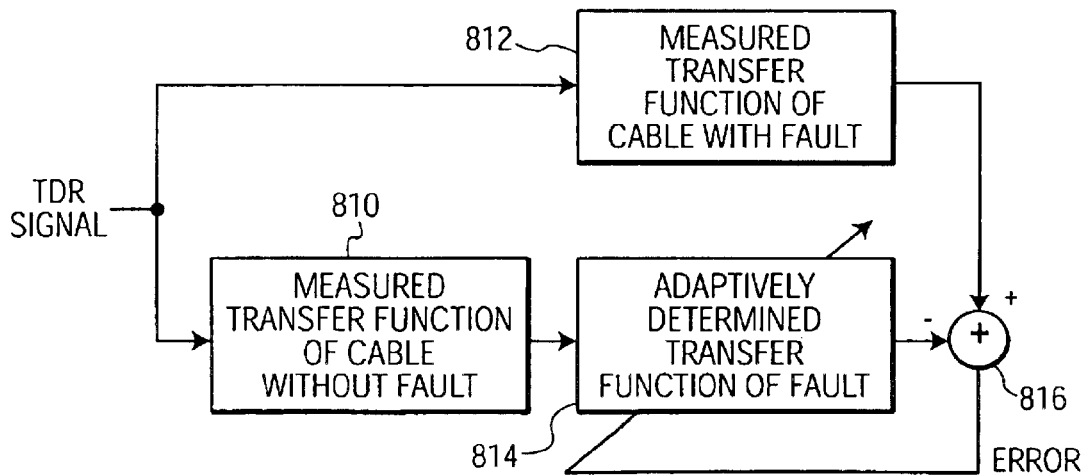
FIG. 8 is a block diagram which shows apparatus that may be used to locate a power line fault using arc reflectometry.
Figure 9:
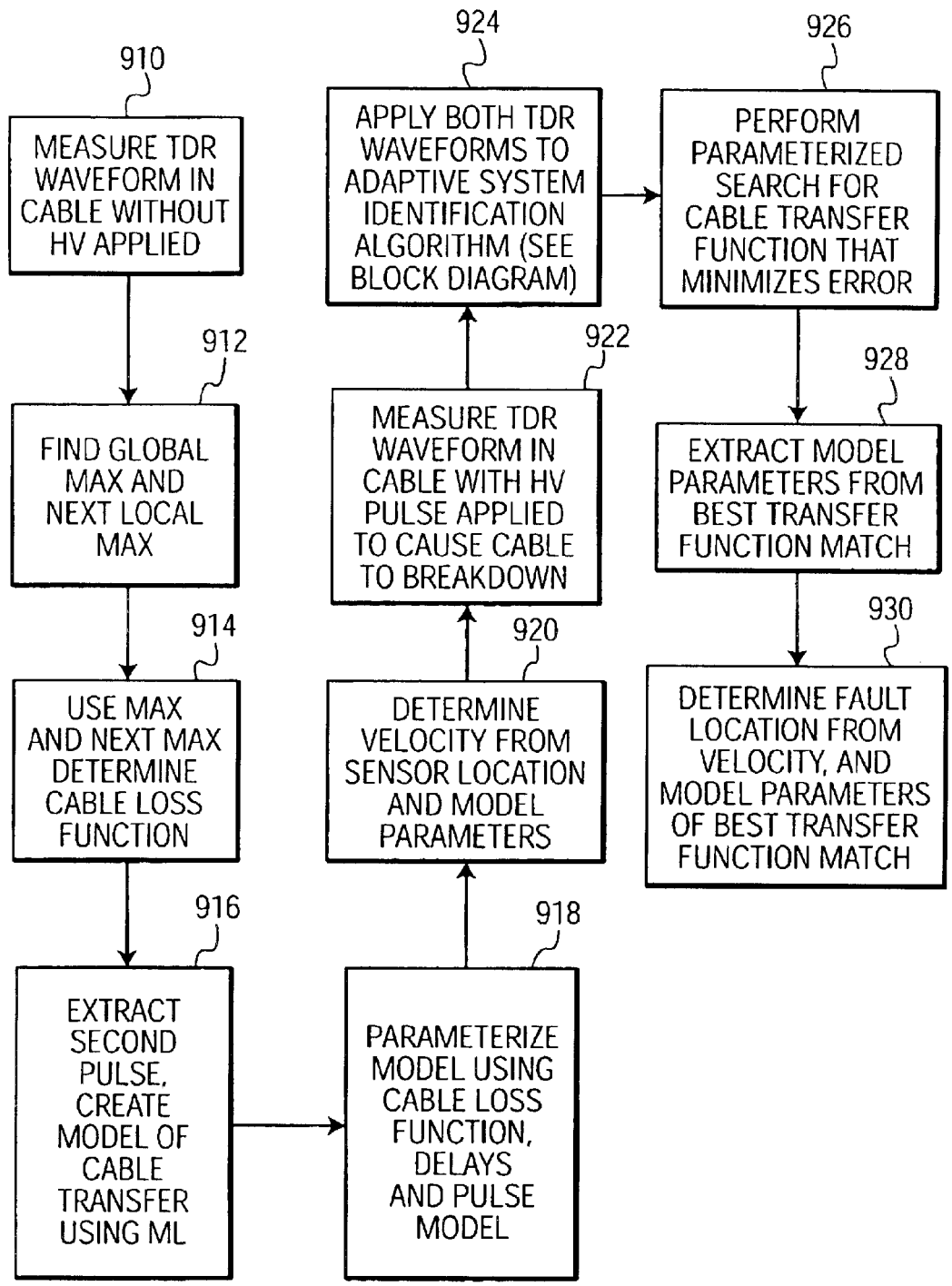
FIG. 9 is a flow-chart diagram which is useful for describing the operation of the apparatus shown in FIG. 8.
Figure 10:
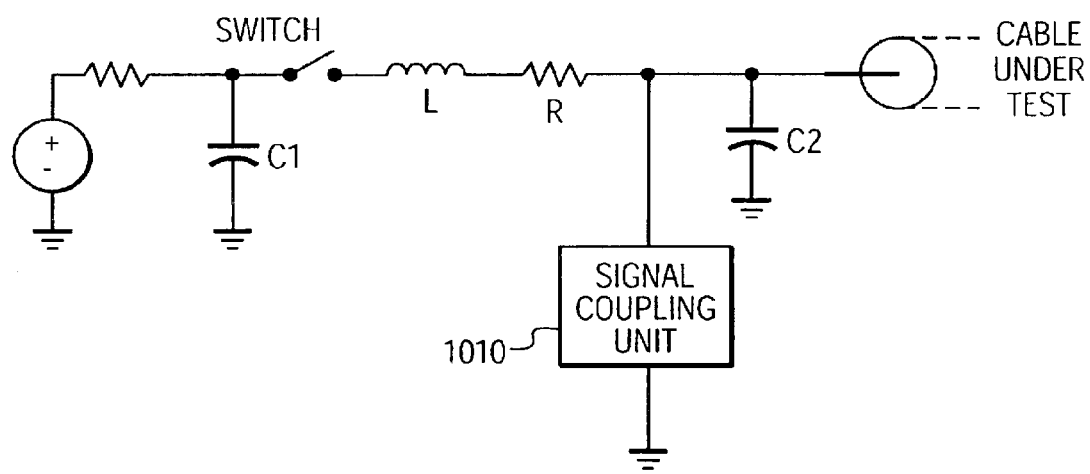
FIG. 10 is a schematic diagram, partly in block diagram form, which is useful for describing the operation of the apparatus shown in FIG. 8.

The process described above is a form of time-domain reflectrometry (TDR). FIGS. 8, 9 and 10 illustrate an alternative fault location process known as Arc Reflectrometry.

Fault locations can also be determined after the cable has a failed by bringing in auxiliary equipment. In one embodiment the FDI monitor can be installed after the fault has occurred and the power system can be re-energized using different means. One simple means is to put a fuse into the system and reclose the switch thereby momentarily re-applying power to the system until the fuse blows. In this manner the fault is re-ignited, the transients are generated and the signature of the fault can be recorded. The only difference in the application is that the automatic gain is set to its maximum and the system is immediately placed in battery powered mode without using the battery saving power down routines. An exemplary procedure may be as follows.

Install an FDI along the URD cable system after the fault has occurred.

Replace the power system fuse and re-close the switch

Record the fault signature using the FDI

Use the algorithm to determine the location of the fault.

Yet another alternative is available which uses an independent power source. An energy discharge unit can be used to apply a high voltage impulse to the LURD cable system. The special nature of this power supply is important to the operation of the algorithms and the successful energization of the power system. In commercially available energy discharge units, often called "thumpers," either wave shaping is not used or inappropriately used. "Thumpers" are designed to find faults on isolated cable sections and not on entire URD cable systems. When thumpers are used to measure the transient fault signatures no wave shaping is used. The result is that the initial thumper pulse applied to the cable and its reflections appear in the transient signature along with the fault signature. This complicates the analysis. Using a wave shape that has a rising edge comparable to the rate of rise of the AC voltage used in the power system eliminates the transients due to the thumper. The reason for this is that the low frequency content of the slow rise AC wave shape is outside of the bandwidth of the measurement system and is not detected. This provides significant improvement in the ability of the system to automatically identify faults.

FIG. 10 is a schematic diagram, partly in block diagram form of circuitry that may be used to apply the impulse of the proper wave shape to the cable under test. In this circuit, capacitor C1 is much larger than C2 and the inductor L, resistor R and capacitor C2 are selected such that the circuit forms a critically damped circuit with a natural frequency near the mains frequency. When the switch is closed, a pulse is applied to the cable under test which has a pulse width that approximates the width of a half cycle of the mains frequency. The signal coupling unit 1010 monitors the cable for transients due to the breakdown of the fault. The unit 1010 may employ either inductive coupling or capacitive coupling. The inventors have determined that this wave shape models a half cycle of mains power to the accuracy needed in the fault location application.

The technology used FDI system can be extended for use in an arc reflection system. The arc reflection test is similar to TDR in the respect that it uses TDR but it is different because it augments the TDR test to find high resistance faults. Reflections from high resistance shunt faults (the most common type) are rarely found using TDR alone. However, auxiliary equipment can be used to convert the fault impedance into a short circuit. Once the fault impedance is converted into a short circuit, it is easily identified using standard TDR methods.

During the arc reflection test, the cable has a high-voltage surge applied to it. This high-voltage surge has a special wave shape tailored to this application. The wave shape is oscillatory and has the shape of an exponentially damped sinusoid. The purpose of this shape is to extend the time that the arc is ignited so that the reflection can be observed on the TDR screen. Specialized TDRs have been developed that are capable of capturing TDR pulses that reflect from the momentary arc created during the surge. The benefit that this technique has is its simplicity in interpretation. The pulses displayed on the TDR screen are the standard type normally seen on a TDR. The fault appears as a significant downward deflection and is readily identified. Furthermore, the TDR trace prior to voltage application is also displayed on the screen making it even simpler to distinguish the change that occurs in the TDR trace when the fault impedance is converted into a short circuit.

When thumpers are used in an arc reflection system designers have not given much consideration to the system impedance when testing an entire URD loop. As described above, an impedance is used to stretch out the voltage application to the system. However, inappropriate selection of the impedance can cause two problems. The first problem is that a high value of limiting impedance can cause most of the thumper voltage to be applied to the limiting impedance and not the URD system. The result is an inability of the power source to energize the URD loop to a voltage high enough to ignite the arc; this is a typical problem. The second problem relates to an inappropriate choice of wave shape. If the wave shape is not close to the shape of the AC mains voltage then damaging reflections can result. This can be seen by considering the application of a high-voltage wave shape with a fast rising edge to a URD cable system; a common wave shape. When a fast rise step is applied to the cable system it reflects from the open circuit end and the return voltage can be doubled. This voltage doubling effect and the damage it does to cable insulation is well known. Furthermore, when testing an entire URD loop, the customers are still connected. An inappropriate wave shape can cause overvoltages to appear at the customer's power service entrance and damage customer equipment. The appropriate power to apply to a URD cable system is the power that it is designed to accommodate an AC mains wave shape.

An added advantage of using arc reflection is that it minimizes the test voltage needed to find the fault. In essence, the cable under test behaves like a surge protection device; it clamps the voltage applied to the cable to the fault breakdown voltage. The rise time of the surge generator, producing the special arc reflection surge, is much slower than the statistical time lag associated with the breakdown. The result is that the voltage applied to the cable barely exceeds the breakdown of the cable since the fault causes breakdown to occur before the voltage rises much beyond the breakdown level. Because of this clamping, increasing the voltage of the surge generator does not increase the applied voltage much beyond the breakdown voltage of the cable, it only increases the current through the fault. This is only true for the arc reflection wave shape. The standard surge wave shape used for thumping will apply voltages proportional to the output voltage of the impulse generator and can theoretically generate transients up to four times the applied voltage, peak to peak.

The apparatus for using arc reflectometry to locate the fault in the power line is shown in FIG. 8. The system applies a signal which approximates an impulse to the circuit under two conditions: first, when no power is applied to the cable and there is no fault in the cable; and second, when power is applied and the fault exists. The processor 810 measures the response to the first impulse and produces an estimate of the impedance transfer function of the system in a no-fault condition. The processor 812 performs the same measurement after the second impulse is applied while the arc is ignited.

When a TDR pulse is applied to a cable, the reflections from various positions in the cable can be normalized to the reflection coefficient at that point in the system. The impedance as a function of length is given as $$Z(z) = Z_0 \frac{1 + \rho(z)}{1 - \rho(z)}$$

Where $Z(z)$ is the impedance as a function of distance, $Z_0$ is the characteristic impedance and $\rho$ is the reflection coefficient. As can be seen, the resulting reflections from the cable can be modeled as an impulse applied to the cable that are modified by the impedance transfer function of the cable. The fault itself is modeled as a change in impedance in the cable or more precisely as a change in the impedance transfer function at the fault location. Using adaptive signal processing the change in the impedance function can be found using adaptive system identification techniques. For example the LMS algorithm can be used. The desired estimate is the difference in impedance transfer of the cable with and without the fault. The difference in the impedance transfer functions can then be used to determine the fault location.

The impedance transfer function of the cable without the fault is subtracted from the impedance transfer function of the cable to generate a difference signal. A third processor 814 uses this difference signal to produce a transfer function for the impedance difference function. This impedance difference function is convolved with the transfer function of the unfaulted line to generate a composite transfer function. Only when this composite transfer function matches the transfer function of the faulted line to some degree of accuracy is the process complete. Once the impedance difference function of the fault has been determined, it is used in the same manner as the fault model in the process shown in FIG. 6 to determine the location of the fault. The only difference is that the algorithm only need find the first pulse in the estimated impedance difference function since this is the location of the fault. In this manner the fault is automatically identified even in situations where the interfering reflections are large.

FIG. 9 is a flow-chart diagram which illustrates the process performed by the apparatus shown in FIG. 8. At step 910, the TDR waveform generated in response to the impulse is measured when the cable is disconnected from the high voltage. This is typically done on installation and then is stored as a reference waveform. At step 912, the global maximum and global minimum of the TDR waveform are determined and, at step 914, these values are used to determine the cable loss function, as described above with reference to FIG. 6. At step 916, the first and second pulses are extracted, as described above with reference to steps 622, 624, 626 and 628 of FIG. 6 to generate a transfer function for the unloaded cable using the maximum likelihood technique. At step 918, the model is parameterized and, at step 920, the velocity of the pulse and the sensor location in the unloaded, fault-free cable is determined. At step 922, the process described with reference to steps 910 through 920 is repeated on the faulted cable with the high-voltage signal applied. At step 924, the determined transfer functions are used to generate idealized responses which are subtracted to produce a difference response, representing an idealized fault response. At steps 926 and 928, a difference transfer function is generated using a parameterized search technique. At step 930, this difference transfer function is used to generate an estimate of the fault location from the parameters of the determined fault transfer function.

The circuitry shown in FIG. 10 may be used to apply the impulse to the cable under test. The method for applying the pulse is the same as described above; the voltage wave shape is a close approximation to the shape of the ac mains. As an alternate method, the power system may be re-fused and the switch re-closed to ignite the fault for the arc reflection method.

While the invention has been described in terms of an exemplary embodiment, it is contemplated that it may be practiced as outlined above with variations that are within the scope of the attached claims.

What is claimed:

1. A fault locator system for an underground residential distribution power cable system which includes a distribution loop having first and second ends the distribution loop including sections of cable connected in series, the junction between any two of the cable sections being coupled to a transformer, at least one end of the distribution loop being coupled to receive a power system signal, the fault locator system comprising:

a fault signature detector coupled to the distribution loop at one of the junctions between two of the cable sections to detect a transient signal representing a fault; and a power supply, coupled to receive operational power from the transformer which is coupled to the junction of the two cable sections.

2. A fault locator system according to claim 1, wherein the fault signature detector includes an antenna coupled to one of the two cable sections to receive a radio frequency (RF) signal which includes the transient signal.

3. A fault locator system according to claim 2, wherein the antenna is responsive to a voltage signal in the distribution loop to detect the transient signal.

4. A fault locator system according to claim 2, wherein the antenna is responsive to a current signal in the distribution loop to detect the transient signal.

5. A fault locator system according to claim 1, wherein the transient signal includes a plurality of pulses, the fault locator further including:

a memory for storing the transient signal;

means for selecting one pulse of the plurality of pulses and creating a pulse model using a predetermined parametrically adjustable pulse model to model the one pulse and a next subsequent pulse of the plurality of pulses, wherein the one pulse and the next subsequent pulse define a pulse signal;

means for adjusting the parameters of the predetermined parametrically adjustable pulse model to minimize differences between the pulse signal and the parametrically adjustable pulse model, whereby the adjusted parameters indicate the location of the fault.

6. A fault locator system according to claim 5, wherein the power system signal is an alternating current signal and the fault locator further includes means for monitoring the power system signal in the distribution loop to determine an instantaneous phase of the power system signal and an instantaneous magnitude of the power system signal immediately before the occurrence of the fault.

7. A fault locator system according to claim 6, further including:

an analog-to-digital converter, coupled to receive the transient signal, to provide a digital transient signal to the fault signature detector; and a variable gain amplifier, responsive to the phase of the power system signal, for adjusting the transient signal in magnitude before applying the transient signal to the analog-to-digital converter.

8. A fault locator system according to claim 7, wherein the fault signature detector includes:

a delay element, coupled between the analog-to-digital converter and the memory for storing a predetermined interval of the digital transient signal to provide a delayed digital transient signal; and means for monitoring the digital transient signal and power system signal to cause the memory to store the delayed digital transient signal when a transition in the transient signal caused by a failure of the power system signal is detected.

9. A fault locator system according to claim 8, wherein the predetermined interval spans an amount of time sufficient to store the transient signal representing a complete fault signature.

10. A fault locator system according to claim 7, wherein the fault signature detector includes:

a delay element, coupled between the analog-to-digital converter and the memory for storing a predetermined interval of the digital transient signal; and means for monitoring the digital transient signal and power system signal to cause the memory to store the delayed digital transient signal when the digital transient signal exceeds a threshold value.

11. A fault locator system according to claim 10, wherein the threshold value is variable responsive to the instantaneous voltage of the power system signal prior to breakdown.

12. A fault locator system according to claim 10, wherein the means for monitoring the transient signal compares the transient signal in magnitude to the threshold value.

13. A fault locator system according to claim 5, wherein the adjusted parameters indicate the location of the fault from both the first and second ends of the distribution loop.

14. A fault locator system according to claim 5, wherein the power system signal is an alternating current signal having a phase, and the fault locator system further includes:

means for determining the phase of the power system signal; and means for analyzing the phase of the power system signal immediately prior to the occurrence of the fault to the transient signal to determine if the fault is between the fault locator system and the first end of the distribution loop or between the fault locator system and the second end of the distribution loop.

15. A fault locator system according to claim 5, wherein the fault signature detector is at a known distance from the first end of the distribution loop, and the fault locator further includes means for comparing the adjusted parameters of the pulse model to predetermined parameter values corresponding to the known distance between the fault signature detector and the first end of the distribution loop to determine if the fault is between the fault locator system and the first end of the distribution loop or between the fault locator system and the second end of the distribution loop.

16. A fault locator system according to claim 1, further including:

a memory for storing the transient signal: and transmitting means for transmitting the stored signal from the memory to a remote fault analyzer, wherein the transmitting means is selected from a group consisting of: a radio frequency transmitter, an optical transmitter, a cellular communications transmitter, and a telephone signal transmitter.

17. A fault locator according to claim 5, further including calibration means comprising:

means for injecting a further transient signal into the distribution loop at one of the first and second ends of the distribution loop;

means for monitoring the distribution loop to identify reflections of the further transient signal; and means for analyzing the reflections of the further transient signal to determine respective time-delay positions of the transformers in the distribution loop.

18. A fault locator according to claim 5, further including means for applying a pulsed power signal to the distribution loop to cause the distribution loop to generate the transient signal, wherein the pulsed power signal approximates one half cycle of an alternating current (AC) mains waveform.

19. A fault locator system according to claim 5, further including means for applying a pulsed power signal to the distribution loop to cause the distribution loop to generate the transient signal, wherein the means for applying the pulsed power signal momentarily applies the power system signal to the distribution loop.

20. A method of detecting faults in an underground residential distribution power cable system which includes a distribution loop having first and second ends, at least one end of the distribution loop being coupled to receive a power system signal, the method comprising the steps of:

storing a fault signal representing the fault in a memory, the fault signal including a plurality of pulses representing an initial fault pulse and reflections of the initial fault pulse;

selecting one pulse of the plurality of pulses and creating a pulse model using a predetermined parametrically adjustable pulse to model the one pulse and a next subsequent pulse of the plurality of pulses, wherein the one pulse and the next subsequent pulse define a pulse signal;

adjusting the parameters of the predetermined parametrically adjustable pulse model to minimize differences between the pulse signal and the parametrically adjustable pulse model, whereby the adjusted parameters indicate the location of the fault.

21. A method according to claim 20, wherein the power system signal is an alternating current signal and the method further includes the step of monitoring the power system signal in the distribution loop to determine an instantaneous phase of the power system signal and an instantaneous magnitude of the power system signal immediately before the occurrence of the fault.

22. A method according to claim 21, further including the steps of:
   digitizing the fault signal to provide a digital fault signal to the fault signature detector; and
   adjusting the fault signal in magnitude, responsive to the determined instantaneous phase of the power system signal, before digitizing the fault signal.

23. A method according to claim 22, wherein the step of storing the waveform in the memory includes the steps of:
   delaying the digitized fault signal by a predetermined interval to provide a delayed digitized fault signal; and
   monitoring the fault signal and the power system signal to store the delayed digital fault signal in the memory when a transition caused by a failure of the power system signal is detected.

24. A method according to claim 23, wherein the step of delaying the digitized fault signal delays the fault signal by an amount of time sufficient to represent a complete fault signature.

25. A method according to claim 24, wherein the method includes the step of storing the delayed digital fault signal in the memory when the fault signal exceeds a threshold value.

26. A method according to claim 25, further including the step of varying the threshold value responsive to the instantaneous voltage of the power system signal.

27. A method according to claim 26 wherein the step of monitoring the power system signal compares the fault signal in magnitude to the threshold value.

28. A method according to claim 20, further including the step of applying a further pulse signal to the distribution loop to cause the distribution loop to generate the fault signal, wherein the further pulse signal approximates one half cycle of an alternating current (AC) mains waveform.

29. A method according to claim 20, further including the step of momentarily applying the power system signal to the distribution loop to cause the distribution loop to generate the fault signal.

30. A fault locator system for an underground residential distribution power cable system which includes a distribution loop, the fault locator system comprising:
   means for providing a pulse signal which approximates an impulse;
   means for applying the pulse signal as a first pulse signal to the distribution loop when no power is applied to the distribution loop and there is no fault in the cable and for measuring a response of the distribution loop to estimate a first impedance transfer function of the distribution loop to the pulse signal when no fault exists;
   means for applying the pulse signal as a second pulse signal to the distribution loop when power is applied and the fault exists and for measuring a response of the distribution loop to estimate a second impedance transfer function of the distribution loop to the pulse signal when the fault exists;
   means for defining a third impedance transfer function as a function of the first impedance transfer function;
   means for adjusting the third impedance transfer function to minimize differences between the second impedance transfer function and the adjusted third impedance transfer function; and
   means for adjusting parameters of a predetermined parametrically adjustable impedance model to minimize differences between the third impedance transfer function and the parametrically adjustable model, whereby the adjusted parameters indicate the location of the fault.

31. A fault locator system according to claim 30, wherein the means for providing the pulse signal provides a signal which approximates one half of one cycle of an AC mains waveform.

32. A fault locator system according to claim 30, wherein the means for providing the pulse signal momentarily applies the power system signal to the faulted cable.

33. A method for locating a fault in an underground residential distribution power cable system which includes a distribution loop, the method comprising the steps of:
   providing a pulse signal which approximates an impulse;
   applying the pulse signal as a first pulse signal to the distribution loop when no power is applied to the distribution loop and there is no fault in the cable and for measuring a response of the distribution loop to estimate a first impedance transfer function of the distribution loop to the pulse signal when no fault exists;
   applying the pulse signal as a second pulse signal to the distribution loop when power is applied and the fault exists and for measuring a response of the distribution loop to estimate a second impedance transfer function of the distribution loop to the pulse signal when the fault exists;
   defining a third impedance transfer function as a function of the first impedance transfer function;
   adjusting the third impedance transfer function to minimize any difference between the second impedance transfer function and the adjusted third impedance transfer function; and
   adjusting parameters of a predetermined parametrically adjustable impedance model to minimize differences between the third impedance transfer function and the parametrically adjustable model, whereby the adjusted parameters indicate the location of the fault.

34. A method according to claim 33, wherein the step of providing the pulse signal provides a signal which approximates one-half of an AC mains waveform.

35. A method according to claim 33, wherein the step of providing the pulse signal momentarily applies the power system signal to the faulted cable.

* * * * *